(12) United States Patent
Gotschke et al.

(10) Patent No.: US 10,727,052 B2
(45) Date of Patent: Jul. 28, 2020

(54) SEMICONDUCTOR CHIP HAVING A MASK LAYER WITH OPENINGS

(71) Applicant: OSRAM OLED GmbH, Regensburg (DE)

(72) Inventors: Tobias Gotschke, Nittendorf (DE); Jürgen Off, Regensburg (DE); Korbinian Perzlmaier, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/240,142

(22) Filed: Jan. 4, 2019

(65) Prior Publication Data

US 2019/0139763 A1 May 9, 2019

Related U.S. Application Data

(62) Division of application No. 15/510,203, filed as application No. PCT/EP2015/069958 on Sep. 1, 2015, now Pat. No. 10,186,423.

(30) Foreign Application Priority Data

Sep. 29, 2014 (DE) ........................ 10 2014 114 109

(51) Int. Cl.
*H01L 27/32* (2006.01)
*H01L 21/02* (2006.01)
*H01L 33/00* (2010.01)
*C30B 25/04* (2006.01)
*C30B 25/18* (2006.01)
(Continued)

(52) U.S. Cl.
CPC ........ *H01L 21/02639* (2013.01); *C30B 25/04* (2013.01); *C30B 25/18* (2013.01); *C30B 29/406* (2013.01); *H01L 21/0242* (2013.01); *H01L 21/0254* (2013.01); *H01L 21/78* (2013.01); *H01L 33/007* (2013.01); *H01L 33/0066* (2013.01); *H01L 33/0095* (2013.01); *H01L 33/22* (2013.01); *H01L 33/32* (2013.01)

(58) Field of Classification Search
CPC ....... H01L 27/30; H01L 27/32; H01L 31/143; H01L 31/145; H01L 31/162
See application file for complete search history.

(56) References Cited

U.S. PATENT DOCUMENTS

2002/0005521 A1 1/2002 Tanabe et al.
2002/0038870 A1 4/2002 Kunisato et al.
(Continued)

FOREIGN PATENT DOCUMENTS

DE 10218498 A1 11/2003
DE 102013200509 A1 7/2014
(Continued)

*Primary Examiner* — Hoai V Pham
(74) *Attorney, Agent, or Firm* — Slater Matsil, LLP (57) ABSTRACT

A semiconductor chip is disclosed. In an embodiment a semiconductor chip includes a multiply-connected mask layer comprising openings, the openings completely penetrate the mask layer and a semiconductor layer sequence, which, at least in places, is in direct contact with the mask layer, wherein the semiconductor layer sequence is disposed on the mask layer, wherein the mask layer comprises a light-transmissive material, and wherein the light-transmissive material comprises an optical refractive index for light which is smaller than a refractive index of the semiconductor layer sequence.

14 Claims, 8 Drawing Sheets

(51) Int. Cl.
*C30B 29/40* (2006.01)
*H01L 21/78* (2006.01)
*H01L 33/22* (2010.01)
*H01L 33/32* (2010.01)

(56) References Cited

U.S. PATENT DOCUMENTS

| | | |
|---|---|---|
| 2004/0077156 A1 | 4/2004 | Tsakalakos et al. |
| 2005/0003572 A1 | 1/2005 | Hahn et al. |
| 2010/0032696 A1 | 2/2010 | Yu et al. |
| 2012/0080660 A1 | 4/2012 | Jung et al. |
| 2015/0349214 A1 | 12/2015 | Meyer et al. |

FOREIGN PATENT DOCUMENTS

| | | |
|---|---|---|
| DE | 102014108301 A1 | 12/2015 |
| EP | 1081818 A2 | 3/2001 |
| JP | 2002009399 A | 1/2002 |
| JP | 2009152334 A | 7/2009 |
| JP | 2011071449 A | 4/2011 |
| WO | 2012093601 A1 | 7/2012 |

FIG 7 ly applied on the growth surface by means of methods such as spin-coating, vaporization or sputtering. For example, the mask material directly adjoins the growth surface of the growth substrate. The mask material is formed with a semiconductor oxide, a semiconductor nitride, a metal oxide or a metal nitride, for example. In particular, the mask material is selected in such a way that a semiconductor material to be applied later grows worse on the mask material than on the growth surface of the growth substrate. Furthermore, the mask material is preferably selected such that it is decomposed by etching, e.g., wet-chemical etching, more rapidly than the material of the growth surface, namely sapphire, and more rapidly than a semiconductor material to be applied later, under the same conditions. The surface of the mask material facing away from the growth substrate can be formed smoothly within the bounds of manufacturing tolerances. Furthermore, it is possible that the surface of the mask material facing away from the growth substrate is roughened in a targeted manner.

SEMICONDUCTOR CHIP HAVING A MASK LAYER WITH OPENINGS

CROSS-REFERENCE TO RELATED APPLICATIONS

This is a divisional application of U.S. application Ser. No. 15/510,203, issued on Jan. 22, 2019 as U.S. Pat. No. 10,186,423, which is a national phase filing under section 371 of PCT/EP2015/069958, filed Sep. 1, 2015, which claims the priority of German patent application 10 2014 114 109.1, filed Sep. 29, 2014, each of which is incorporated herein by reference in its entirety.

TECHNICAL FIELD

The present invention relates generally to a system and method for producing a plurality of semiconductor chips and semiconductor chip.

BACKGROUND

The US patent application publication US 2005/0003572 A1 describes methods for producing a plurality of semiconductor chips.

SUMMARY

Embodiments of the invention provide a method for producing a plurality of semiconductor chips, which can be used in a particularly flexible manner. Further embodiments of the invention provide a semiconductor chip, which can be produced in a particularly cost-efficient manner.

Provided is a method for producing a plurality of semiconductor chips. Furthermore, a semiconductor chip is provided. In particular, the semiconductor chip described herein can be produced with a method described herein for producing a plurality of semiconductor chips. In other words, all features disclosed for the method for producing a plurality of semiconductor chips are also disclosed for the semiconductor chip and vice versa.

According to at least one embodiment of the method for producing a plurality of semiconductor chips, a growth substrate is provided, which comprises a growth surface which is formed with sapphire. For example, the growth substrate can be a sapphire substrate, which completely consists of sapphire. Furthermore, the growth substrate may be a composite substrate, in which merely part of the substrate, including the growth surface, is formed with sapphire.

The growth surface of the growth substrate is provided for the semiconductor material to be deposited thereon, e.g., epitaxially. In particular, the growth surface of the growth substrate is un-structured in the present case. In other words, the growth surface of the growth substrate is formed to be smooth and/or flat within the bounds of manufacturing tolerances and, in particular, does not comprise any pattern that has been produced in a targeted manner.

In particular, the growth substrate is not a so-called pre-structured sapphire substrate in the present case, which can particularly be used for growing GaN-based layers.

According to at least one embodiment of the method, a mask material is applied on the growth surface of the growth substrate. The mask material may cover the growth surface as completely as possible. In other words, the mask material covers at least 90%, in particular at least 95%, e.g., 100% of the growth surface of the growth substrate. The mask material can be applied on the growth surface by means of methods such as spin-coating, vaporization or sputtering. For example, the mask material directly adjoins the growth surface of the growth substrate. The mask material is formed with a semiconductor oxide, a semiconductor nitride, a metal oxide or a metal nitride, for example. In particular, the mask material is selected in such a way that a semiconductor material to be applied later grows worse on the mask material than on the growth surface of the growth substrate. Furthermore, the mask material is preferably selected such that it is decomposed by etching, e.g., wet-chemical etching, more rapidly than the material of the growth surface, namely sapphire, and more rapidly than a semiconductor material to be applied later, under the same conditions. The surface of the mask material facing away from the growth substrate can be formed smoothly within the bounds of manufacturing tolerances. Furthermore, it is possible that the surface of the mask material facing away from the growth substrate is roughened in a targeted manner.

According to at least one embodiment of the method, patterning the mask material into a multiply-connected mask layer is effected by introducing openings into the mask material. In other words, openings are introduced into the mask material, for example, by means of a photo-chemical method, which openings are formed in such a way that the mask material is patterned into a multiply-connected mask layer. The openings completely penetrate the mask material at least in places in such a way that the growth surface is exposed at the bottom of at least some of the openings in the mask material, in particular at least 90% of the openings, preferably all openings.

Due to this complete penetration of the mask material for forming the mask layer, the mask layer is not simply-connected, but multiply-connected after forming the openings.

Preferably, the openings are generated at such distances to one another that they do not penetrate one another and do not overlap with each other. In other words, large part of the openings, in particular at least 90% of the openings, preferably all openings, are completely surrounded by mask material in lateral directions, i.e., directions running parallel to the growth surface. A region of the mask layer, which is formed with mask material, is thus located between neighboring openings.

According to at least one embodiment of the method, an application of a semiconductor layer sequence is effected on the mask layer and on the growth surface. The semiconductor layer sequence is epitaxially deposited as a semiconductor material, for example. In particular, the mask material is selected such that the semiconductor material rather grows on the growth surface of the growth substrate, i.e., at the bottom of the openings, than on the mask layer. Thus, initially isles of semiconductor material are formed in the openings, which coalesce into the semiconductor layer sequence after being grown over by the mask layer. In this way, the semiconductor layer sequence grows together from a plurality of semiconductor isles, the seeds of which are in the openings of the mask material, on the growth surface.

For example, the semiconductor layer sequence is formed with a nitride semiconductor. In other words, the semiconductor layer sequence is based on a nitride semiconductor compound material. In the present context, this may mean that the semiconductor layer sequence or at least a part thereof comprises or consists of a nitride semiconductor compound material, preferably $Al_nGa_mIn_{1-n-m}N$, with $0 \leq n \leq 1$, $0 \leq m \leq 1$ and $n+m \leq 1$. Here, this material does not necessarily have to comprise an exact mathematical representation of the above formula. For example, it may rather comprise one or multiple dopants as well as additional constituents. For reasons of simplicity, however, the above formula includes only the essential constituents of the crystal lattice (Al, Ga, In, N), even though these may be replaced and/or supplemented by little amounts of further substances.

According to at least one embodiment of the method, a singulation of at least the semiconductor layer sequence into a plurality of semiconductor chips is effected, each semiconductor chip comprising lateral dimensions. The lateral dimensions of the semiconductor chip are the edge lengths thereof, for example. The lateral dimensions of a large part of the semiconductor chips, in particular at least 90% of the semiconductor chip, preferably all semiconductor chips, are large compared to an average distance of the openings in the mask layer to the nearest opening in the mask layer. In other words, each opening in the mask layer comprises a nearest opening, to which the distance thereof is smaller than the distance to other openings in the mask layer. The average value of these distances for a large part of the openings, in particular at least 90% of the openings, preferably for all of these openings, is small compared to the lateral dimensions of the semiconductor chip.

In other words, a raster is not provided by the mask layer such that a later semiconductor chip is to be assigned to each opening in the mask material in an unambiguous manner, but the later semiconductor chips extend over a plurality of openings, so that four or more openings are to be assigned to each semiconductor chip. For example, one thousand or more openings are to be assigned to each semiconductor chip.

According to at least one embodiment of the method for producing a plurality of semiconductor chips which is described herein, the method comprises the following steps:
providing a growth substrate, which comprises a growth surface, which is formed with sapphire, —applying a mask material on the growth surface of the growth substrate,
patterning the mask material into a multiply-connected mask layer by introducing openings into the mask material, wherein the growth surface is exposed at the bottom of at least some of the openings,
applying a semiconductor layer sequence on the mask layer and on the growth surface,
singulating at least the semiconductor layer sequence into a plurality of semiconductor chips, wherein each semiconductor chip comprises lateral dimensions and the lateral dimensions are large compared to an average distance of the openings to the nearest opening.

In particular, the method can be performed in the described order.

In particular, the method described herein can be used for producing optoelectronic semiconductor chips. The optoelectronic semiconductor chips can be light-emitting semiconductor chips, for example, which, in operation, emit electromagnetic radiation in the spectral range from UV radiation to infrared radiation. For improving the out-coupling of the optoelectronic semiconductor chips, in which the sapphire substrate remains with the semiconductor layer sequence (so-called sapphire chips), pre-structured sapphire substrates can be used, the structures of which improve the out-coupling of light by increasing the probability for light emission in relation to the entire chip.

Furthermore, pre-structured sapphire substrates have proven to be advantageous with respect to growing the following semiconductor materials.

However, this leads to the problem that particularly in epitaxially growth, the growth selectivity is low between planar and structured surface of the sapphire substrate. In contrast, patterning the growth surface of the sapphire substrate can be omitted with the present method. Instead, a mask layer is used, which is formed with a mask material, on which the semiconductor material of the semiconductor layer sequence grows worse than on the sapphire surface of the growth substrate, i.e., the growth surface. In this way, an increased growth selectivity is achieved in epitaxial deposition.

Surprisingly, it has been found that the mask layer can be selected in such a way that it can either remain in the finished semiconductor chip for improving the outcoupling of light or patterning the semiconductor layer sequence is achieved after removal of the mask layer, which improves an outcoupling of light. Furthermore, the mask layer may facilitate removal of the sapphire substrate in the case that the semiconductor layer sequence is to be removed from the substrate. In other words, the method described herein is suitable for both the production of sapphire chips and the production of thin film chips, which are free from a growth substrate. This allows standardizing the substrates and the epitaxy processes for the production of sapphire chips and thin film chips, which simplifies and reduces costs for the production of optoelectronic semiconductor chips overall. The method described herein can thus be used in a particularly diverse manner.

Furthermore, with respect to the optical properties of the mask material, the mask material can be selected in such a way that it improves the optical properties of the optoelectronic semiconductor chip by reflection, total reflection and/or light refraction, for example, by improving the outcoupling of light and the radiation characteristics.

In the method described herein, it is possible that each of the produced semiconductor chips comprises a lateral dimension, e.g., a largest edge length of the semiconductor chip, and the lateral dimension is large compared to an average distance of the openings to the nearest opening. The largest edge length can be at least 200 am, at least 500 µm, or at least 1,000 µm, for example. The lateral dimension of the semiconductor chip is thus preferably at least ten times, or at least 50 times, or at least 100 times, or at least 1,000 times greater than the average distance.

According to at least one embodiment of the method, the semiconductor layer sequence, the mask layer and the growth substrate are severed multiple times during singulation. In this case, it is particularly possible that the growth substrate and the mask layer remain in the finished semiconductor chip, i.e., the produced semiconductor chips are sapphire chips. In the sapphire chips produced this way, the semiconductor layer sequence directly adjoins the growth substrate in the region of the openings in places, whereas in other regions, the mask layer is arranged between the semiconductor layer sequence and the growth substrate. Light may exit through the sapphire substrate, for example. In this case, the mask layer is preferably selected to be transmissive or transparent for the light generated in the semiconductor chip. Furthermore, it is possible that a light exit is provided at the side of the semiconductor layer sequence facing away from the sapphire substrate. In this case, the mask layer serves as a reflector.

According to at least one embodiment of the method, the mask layer is at least partially removed prior to or after the singulation. In this case, it is possible that the growth substrate is removed from the semiconductor layer sequence or remains thereon. In the case that the growth substrate remains with the semiconductor layer sequence, hollow spaces, e.g., filled with gas, are arranged between the semiconductor layer sequence and the growth substrate in places where the mask layer had previously been arranged. Light refraction and/or reflection may take place at these gas-filled interspaces or recesses.

According to at least one embodiment of the method, the growth substrate is removed from the semiconductor layer sequence prior to or after singulation. A removal of the growth substrate can be effected via a laser lift-off process, for example, in which laser radiation is absorbed at the interface between the growth substrate, the semiconductor layer sequence and the mask layer. The mask layer may remain on the semiconductor layer sequence then, or be removed after that. After removal of the mask layer, the semiconductor layer sequence is patterned in accordance with the openings of the mask layer, i.e., it comprises elevations and depressions, for example, which increases the probability of a light exit during operation of the semiconductor chip. Furthermore, it is possible that the growth substrate is removed after the removal of the mask layer. Surprisingly, it has been found that a removal of the semiconductor layer sequence from the substrate can readily be effected automatically due to the tension between the sapphire substrate and, e.g., the nitride semiconductor compound material of the semiconductor layer sequence, or by slight mechanical impact. An elaborate laser separation method can be omitted in this case. In the present case, this is made possible particularly in that the mask layer is formed as a multiply-connected layer, in which mask material regions are arranged between the openings.

According to at least one embodiment of the method, the mask material contains a silicon oxide or consists of a silicon oxide. For example, the mask material is silicon dioxide. A mask material formed with silicon oxide is particularly characterized in that it is transmissive and/or not or hardly absorbent for electromagnetic radiation generated in the optoelectronic semiconductor chip and has a refractive index that is smaller than the refractive index of the growth substrate, i.e., e.g., the refractive index of sapphire, and which is smaller than the optical refractive index of the semiconductor layer sequence, e.g., averaged across the semiconductor layer sequence. Furthermore, a mask layer formed with silicon oxide can be patterned and dissolved wet-chemically without damaging the growth substrate and the semiconductor layer sequence excessively. The layer formed from silicon oxide, e.g., silicon dioxide, can lead to total reflection due to the refractive index, which is low in relation to the semiconductor layer sequence and sapphire, and is thus also particularly suitable as a reflective layer.

According to at least one embodiment of the method, a distance between nearest openings in the mask material is between at least 0.5 µm and 15 µm at the most at least for some openings, in particular for a large part of the openings, e.g., for at least 90% or preferably for all openings. This range for the distance between nearest openings has proven to be particularly advantageous both for achieving semiconductor layer sequences of good crystalline quality and with respect to the possible optical use of the mask layer in the later component.

According to at least one embodiment of the method, the openings in the mask material are arranged at the lattice points of a regular lattice within the bounds of manufacturing tolerances. The regular lattice may be a hexagonal or a cubic lattice, for example.

According to at least one embodiment of the method, a maximum lateral opening dimension for at least some of the openings is between at least 0.3 µm and 2.0 µm at the most. Due to this size of the openings, regions of the semiconductor layer sequence are formed in the openings, which are particularly well suitable for increasing the probability for light exit from the semiconductor layer sequence.

According to at least one embodiment, the openings in the mask material each have a three-dimensional shape. The three-dimensional shape of the openings can be formed symmetrically, e.g., rotation-symmetrically. For example, the three-dimensional shape of the openings may be similar to or form an inverted truncated rotational body or truncated polyhedron, e.g., an inverted truncated cone or truncated pyramid.

Accordingly, the elevations of the semiconductor layer sequence generated in the openings may have a three-dimensional shape, which is symmetric, e.g., rotation-symmetric. In particular, the three-dimensional shape is similar to a truncated rotational body or truncated polyhedron, e.g., a truncated cone or a truncated pyramid. The height of the elevations depends on the thickness of the mask layer.

According to at least one embodiment, the mask layer has a thickness which is measured in a direction perpendicular to the growth surface of the growth substrate, for example. The thickness of the mask layer and/or the height of the elevations is particularly between at least 0.2 µm and 10 µm at the most. The thickness of the mask layer determines the height of the elevations of the semiconductor layer sequence, for which the openings in the mask layer give a shape in the same way.

According to at least one embodiment of the method, the semiconductor layer sequence is formed completely over the mask layer. In other words, the mask layer is formed such that it is formed to be thicker than the mask layer, so that the mask layer is completely covered by the semiconductor layer sequence at least in a central region of the semiconductor layer sequence from a side of the mask layer facing away from the growth substrate. It is possible that the mask layer laterally protrudes from the semiconductor layer sequence in an edge region of the semiconductor layer sequence.

The openings in the mask layer as well as the elevations resulting therefrom in the semiconductor layer sequence may comprise side surfaces, which are limited by the growth surface on one side, and by the semiconductor layer sequence on the other side. In particular, the openings and the elevations are limited laterally by at least one side surface. In a cross-sectional view, the side surface may form an angle of ≤90° with the growth surface. For example, the side surface forms an angle of at least 45° and 90° at the most with the growth surface. In particular, the angle may be selected to be between at least 55° and 85° at the most.

Furthermore, a semiconductor chip is provided, which can be produced by means of a method described herein, for example.

According to at least one embodiment of the semiconductor chip, the semiconductor chip comprises a growth substrate, which comprises a growth surface, which is formed with sapphire, a multiply-connected mask-layer, which comprises openings that completely penetrate the mask layer, a semiconductor layer sequence, which, in the region of the openings, is in direct contact with the growth surface at least in places and which is in direct contact with the mask layer at least in places, wherein the semiconductor layer sequence completely is formed over the mask layer and the mask layer is formed with a light-transmissive material, which has an optical refractive index for light that is smaller than the refractive index of the growth substrate and that is smaller than the refractive index of the semiconductor layer sequence.

Thus, the semiconductor chip is a sapphire chip, in which a mask layer made of a light-transmissive material having a refractive index lower than the directly adjacent material is arranged between the semiconductor layer sequence and the growth substrate. The mask layer is designed in a multiply-connecting fashion and comprises a plurality of openings, in which the semiconductor layer sequence is directly adjacent to the growth surface of the growth substrate. The semiconductor chip is characterized by a particularly high outcoupling of light due to the low-refractive mask layer.

The semiconductor chip comprises, within the semiconductor layer sequence, at least one active region that generates light which is provided for generating light during operation of the semiconductor chip. For example, electromagnetic radiation of the spectral range from UV radiation to infrared radiation can be generated in the active region during operation of the semiconductor chip.

The patterning sizes of the mask layer are selected as stated above, so that the mask layer in the semiconductor chip comprises four or more openings, e.g., for example, thousand or more openings. In the semiconductor chip, light may exit through the growth substrate. Furthermore, it is possible that the semiconductor chip is mounted at the intended place on the side of the growth substrate facing away from the semiconductor layer sequence, the mounting surface designed in a reflective manner. Just as well, the mask layer is of particular advantage since due to the refractive index jump between the mask layer and the semiconductor layer sequence, e.g., by total reflection, a reflection can be effected away from the sapphire substrate, whereby effects such as aging of the reflective material at the intended place of the semiconductor chip or of the joining material, by means of which the semiconductor chip is fastened at the intended place, can be reduced.

BRIEF DESCRIPTION OF THE DRAWINGS

Hereinafter, the method described herein as well as the semiconductor chip described herein will be explained in greater detail by means of exemplary embodiments in conjunction with the associated figures.

Method steps of a method described herein are explained in greater detail in FIGS. 1A, 1B, 1C, 1D, 2A, 2B, 2C, 3A, 3B, 3C, 4A, 4B and 4C.

Method steps of methods described herein as well as exemplary embodiments of semiconductor chips described herein are explained in greater detail in FIGS. 5A, 5B, 5C, 6A, 6B, 6C, 6D, 6E, 6F and 7.

Like, similar or equivalent elements are provided with the same reference numerals throughout the figures. The figures and the dimensional relationship between the elements illustrated in the figures are not drawn to scale. Individual elements may rather be illustrated with an exaggerated size for a better illustration and/or for a better understanding.

DETAILED DESCRIPTION OF ILLUSTRATIVE EMBODIMENTS

FIGS. 1A to 1D show schematic sectional illustrations of method steps of exemplary embodiments of methods for producing a plurality of semiconductor chips described herein.

Figure 1A:
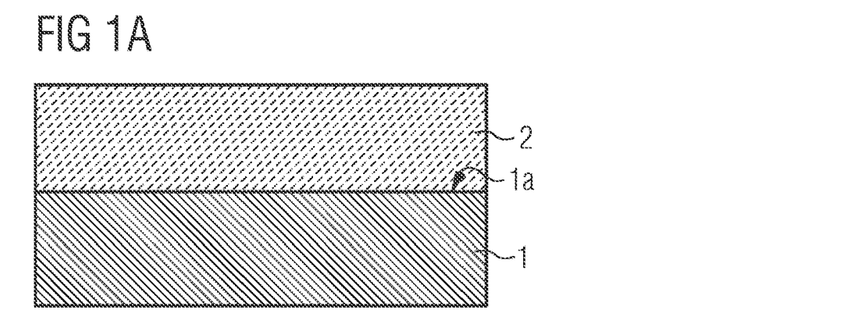

First, a growth substrate 1 is provided for the method. The growth substrate 1 comprises a growth surface 1a (see FIG. 1B), which is formed with sapphire. For example, the growth substrate consists of sapphire to that end.

On the growth surface 1a of the growth substrate is applied a mask material 2, which can be formed with an oxide or a nitride, for example. In the present exemplary embodiment, the mask material 2 consists of a silicon oxide.

Figure 1B:
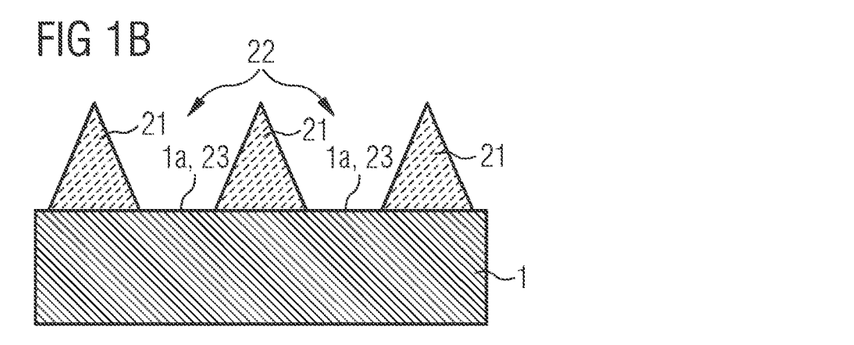
Figure 1C:
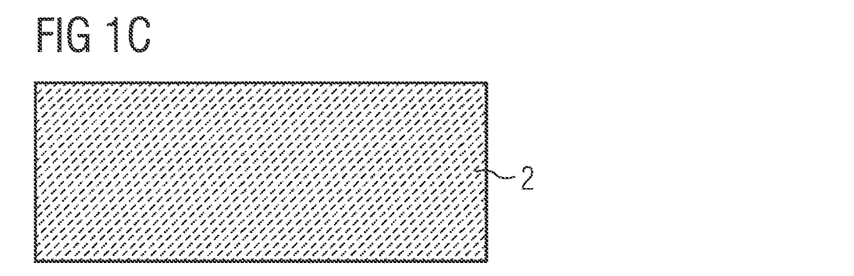
Figure 1D:
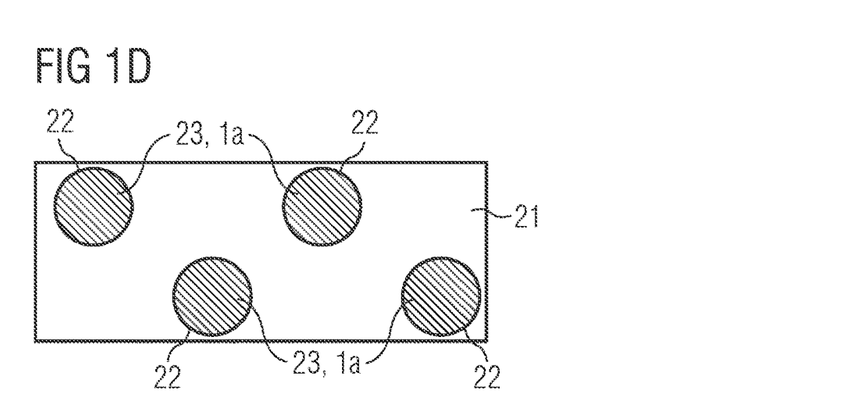

In a further method step, FIG. 1B, openings 22 are generated in the mask material 2. This is also explained in a schematic plan view in conjunction with FIGS. 1C and 1D. In a plan view, the openings 22 are completely surrounded by the mask material, so that the mask layer 21 is formed in a multiply-connected manner. The openings 22 have the shape of a truncated pyramid or a truncated cone, for example. The growth substrate 1 is exposed at the bottom 23 of preferably each opening 22, so that the sapphire growth surface 1a is exposed there.

Figure 2A:
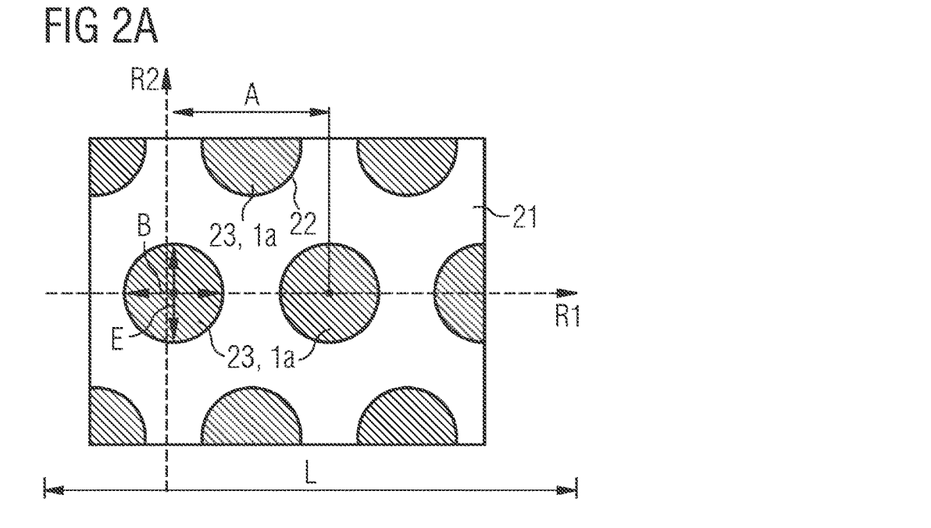
Figure 2B:
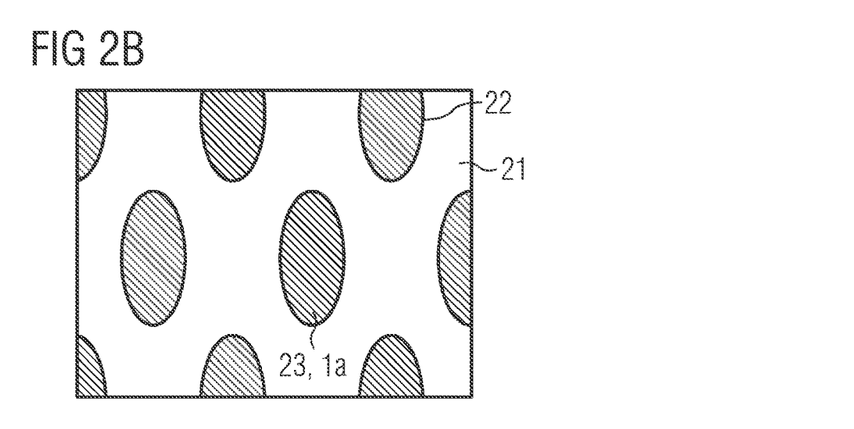
Figure 2C:
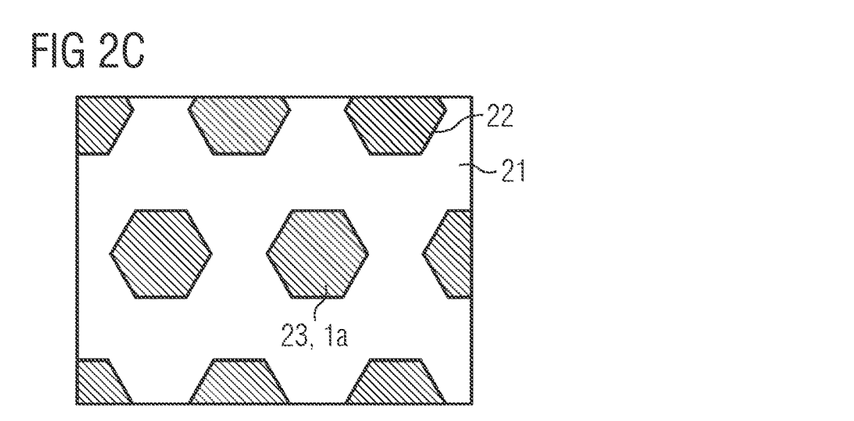

Different configurations of the openings 22 and thus the mask layer 21 are explained in greater detail in conjunction with the schematic plan views of FIGS. 2A, 2B and 2C. The cross-section shown in FIG. 1B corresponds to a cross-section along line R1 in FIG. 2A, for example.

As can be seen from FIG. 2A, the openings comprise a circular edge in a plan view, wherein the openings are arranged to be laterally spaced from one another at a distance A at the lattice points of a regular lattice. In other words, the openings 22 are separate regions, which do not comprise any connection amongst one another in a plan view. For example, the distance between directly neighboring openings A is at least 0.5 μm and 15 μm at the most. The opening dimensions B and E of the openings in lateral directions can be between at least 0.3 m and 2 μm at the most, for example.

The schematic plan views of FIGS. 2B and 2C illustrate further possible shapes for the edge of the openings 22 in the plan view. For example, the edges can be designed to be oval or elliptical (see FIG. 2B) or in the shape of a regular polygon, e.g., a regular hexagon (see FIG. 3C).

The configuration of the openings, the position thereof and the distance of the openings amongst one another are to be understood to be within the bounds of manufacturing tolerances. In other words, deviations from the shapes ideally illustrated in the figures may occur due to the manufacturing method.

Figure 3A:
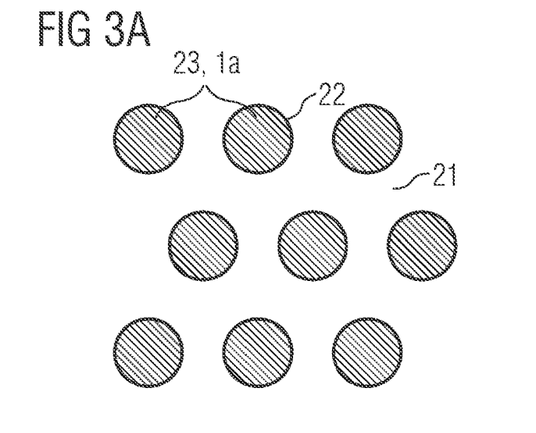
Figure 3B:
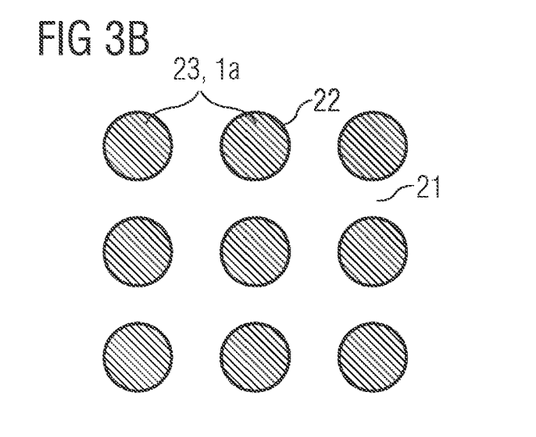
Figure 3C:
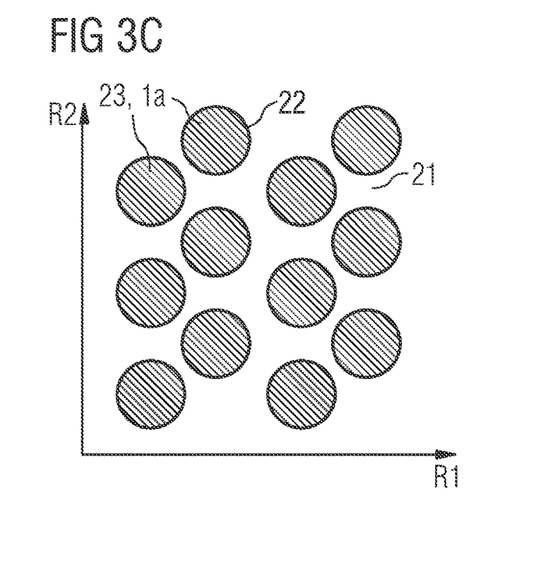

Different options for arranging the openings 22 are explained in greater detail by means of FIGS. 3A to 3C. For example, the openings may be arranged at lattice points of a hexagonal lattice (see FIG. 3A) or a cubic lattice (see FIG. 4B). Furthermore, the openings may be subject to another regular pattern regarding the arrangement thereof, the lattices being spanned along the lateral extension directions R1, R2 by translation.

Figure 4A:
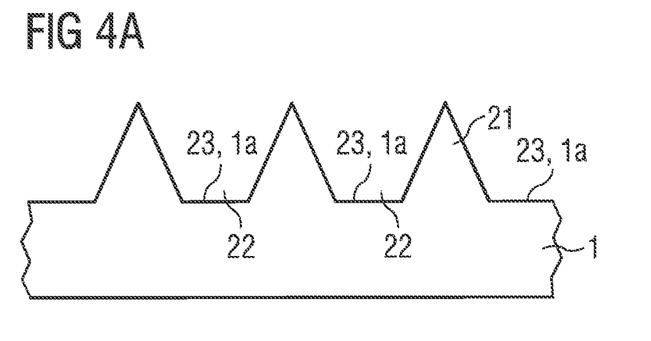
Figure 4B:
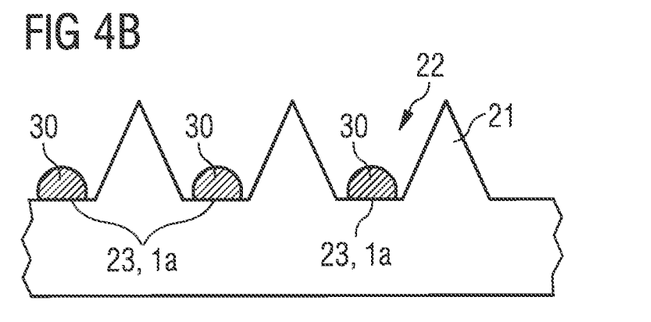
Figure 4C:
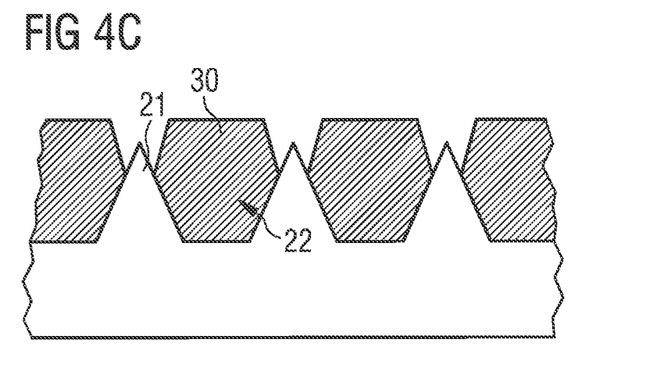

A growth of semiconductor material 30 in the openings 22 of the mask layer 21 is explained in greater detail in conjunction with the schematic sectional illustrations of FIGS. 4A to 4C. The sapphire growth substrate 1a of the growth substrate 1 is exposed at the bottom 23 of the openings 22. The material of the mask layer 21, i.e., the mask material 23, is selected such that a growth of the semiconductor material 30 for forming the semiconductor layer sequence 3 preferably grows on the growth surface 1a compared to the mask material 21.

A seeding through the semiconductor material 30 is thus effected in the region of the openings 22 first, at the bottom surface 23 thereof on the growth surface 1a. Upon continuation of the growth, openings 22 are filled with the semiconductor material 30 starting from the growth surface 1a (see FIG. 4C). Upon a further continued growth, the gaps between the individual growth regions of the semiconductor material 30 are closed and the semiconductor regions coalesce into the semiconductor layer sequence.

Figure 5A:
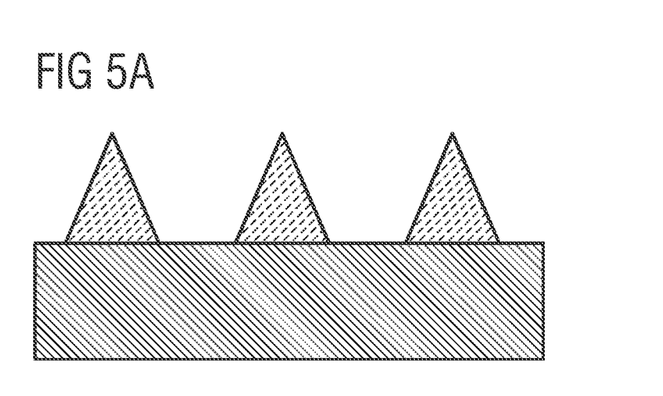
Figure 5B:
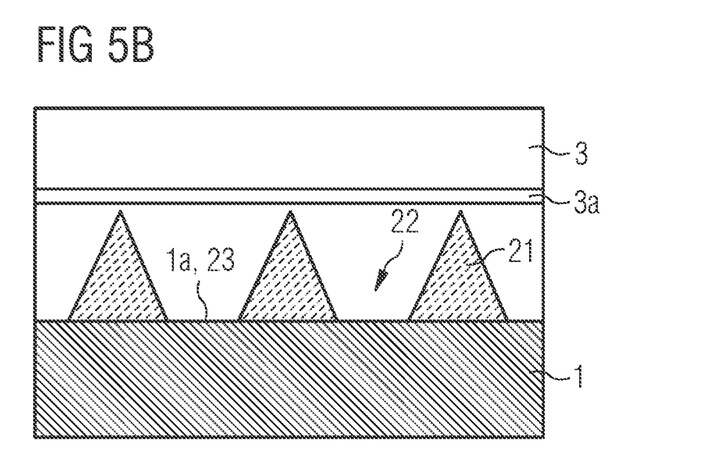
Figure 5C:
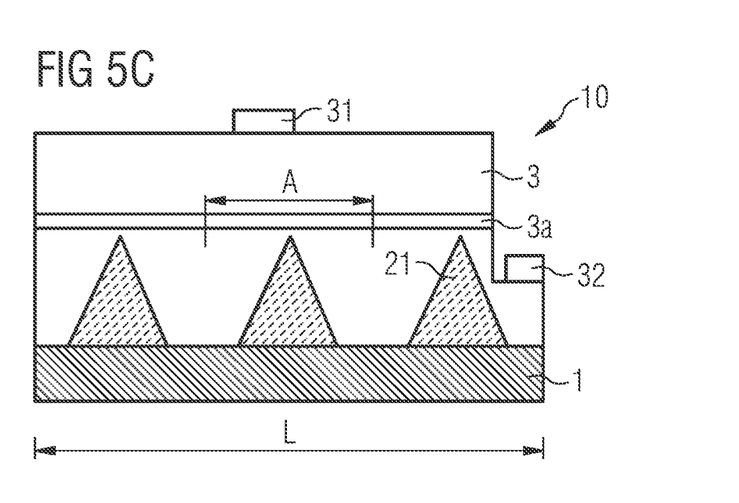

This is illustrated in conjunction with FIGS. 5A and 5C, for example.

It is shown there that the semiconductor layer sequence 3 is completely formed over the mask layer 21 and is grown to be a closed semiconductor layer sequence above the mask layer, which may comprise an active region 3A for generating electromagnetic radiation, in particular light.

It is illustrated in conjunction with FIG. 5C that an application of contact elements 31 on the semiconductor layer sequence 3 can be effected after the singulation, the contact elements contacting the semiconductor chip on the p and n side. In this embodiment of the semiconductor chip, the sapphire-containing growth substrate 1 remains in the semiconductor chip. The distance A between directly neighboring openings 22 is small compared to the lateral extension or dimension L of the semiconductor chip. In other words, a plurality of openings 22, which are filled with the semiconductor material of the semiconductor layer sequence 3, is located in the semiconductor chip. The mask layer 21 is arranged between the semiconductor layer sequence 3 and the growth substrate.

Another exemplary embodiment of a method described herein is explained in greater detail in conjunction with the schematic sectional illustrations of FIGS. 6A, 6B, 6C, 6D, 6E, and 6F. Just as well, in this method, first a growth substrate 1 with a sapphire-containing growth surface 1a is provided, on which a mask layer 21 having openings 22, which completely penetrate the mask layer, is applied. It is possible in this exemplary embodiment that the mask 21 is formed with a radiation-non-transmissive metal oxide or semiconductor oxide, metal nitride or semiconductor nitride. For example, the mask layer may consist of a silicon oxide or a silicon nitride.

Figure 6A:
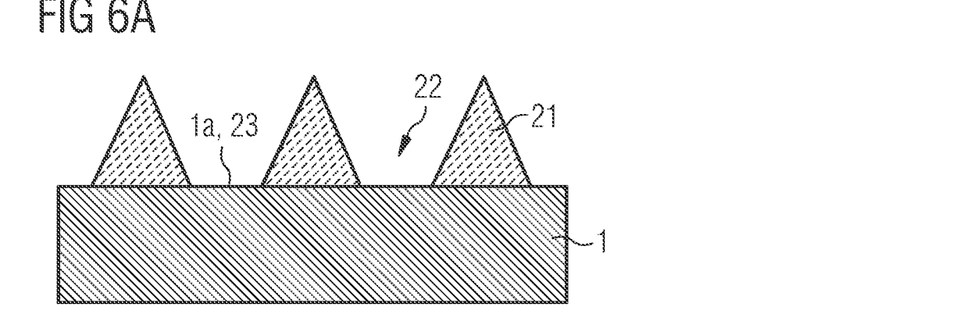
Figure 6B:
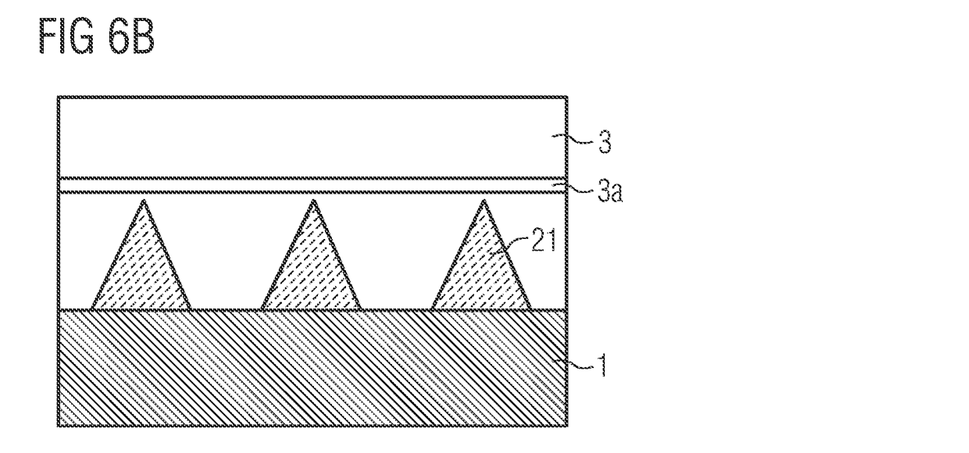

Subsequently, the semiconductor layer sequence is generated in the openings 22 first, and beyond these openings after that (FIG. 6B).

Figure 6C:
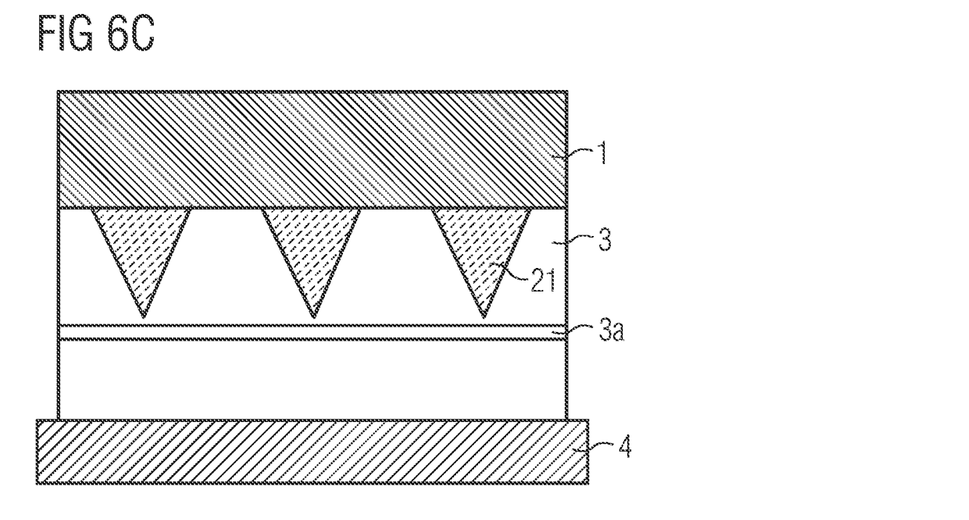

In a next method step, the semiconductor layer sequence can be fastened on a carrier 4 with its surface facing away from the growth substrate 1, where this carrier may be a carrier which is formed with an electrically conductive material such as copper, doped germanium or doped silicon. Furthermore, the carrier 4 may be a connection carrier, e.g., a circuit board.

Figure 6D:
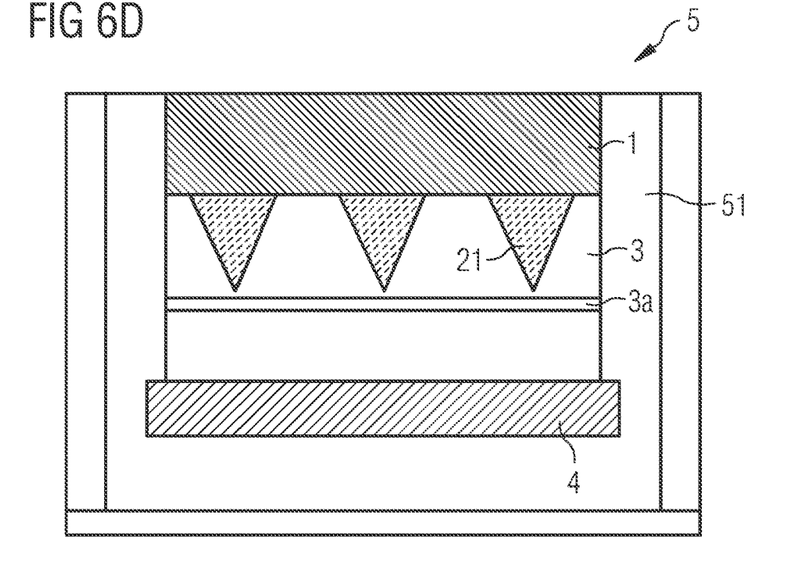
Figure 6E:
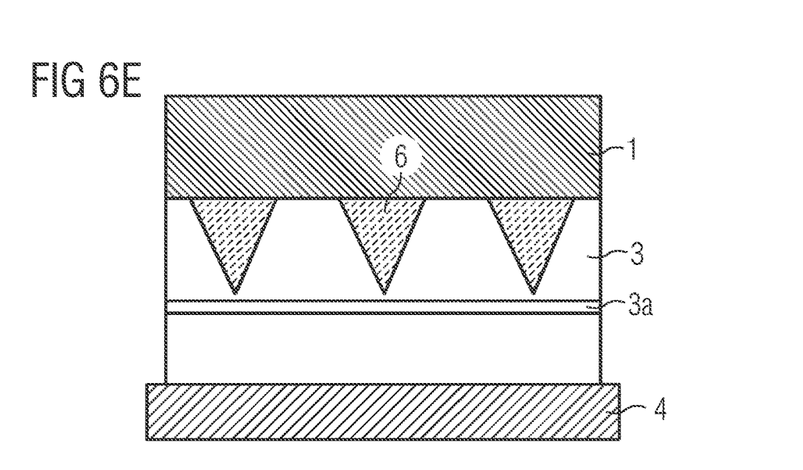

FIG. 6D illustrates that this combination of carrier 4, semiconductor layer sequence 3, mask layer 21 and growth substrate 1 is introduced into an etching bath 5, which is filled with an etching liquid 51. The mask material 21 is selectively dissolved in the etching liquid 51, see FIG. 6E. Since the mask material does not remain in the finished semiconductor chip in this exemplary embodiment of the method described herein, the mask material can be selected with regard to its selective etchability toward the material of the semiconductor layer sequence 3 as well as toward the growth substrate 1.

Figure 6F:
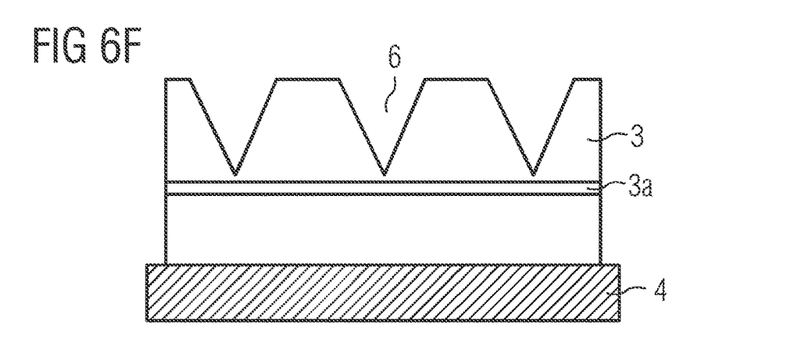

FIG. 6F shows the finished semiconductor chip after singulation. Recesses 6 are located in the region of the mask layer 21 and the semiconductor layer sequence 3 comprises a pattern on its side facing away from the carrier 4, through which a probability for a total reflection at the outer surface of light generated in the semiconductor chip is reduced, for example, so that the probability for the light exit is increased overall. The shape of the openings 22 in the mask material 2 sets the shape of the pattern at the outer surface of the semiconductor layer sequence 3, so that the shape for these structures of the semiconductor layer sequence is possible by the selection of the shape of the openings.

Figure 7:
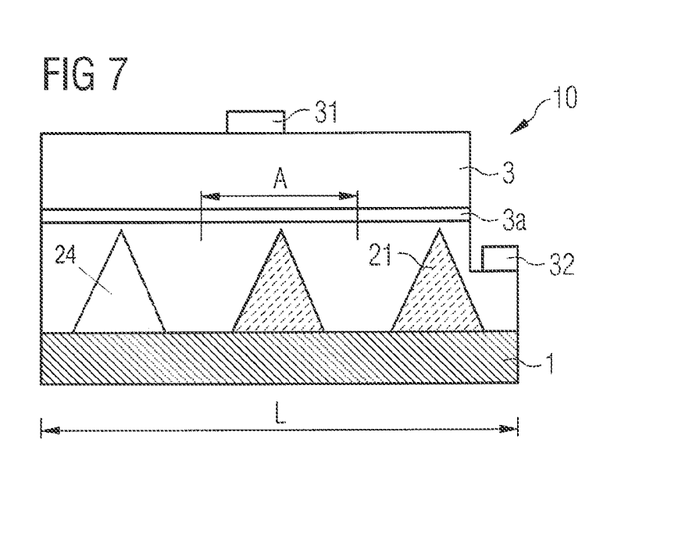

FIG. 7 shows the semiconductor chip 10 of FIG. 5C in which the mask layer 21 is at least partially removed. Hollow spaces 24, e.g., filled with gas, are arranged between the semiconductor layer sequence 3 and the growth substrate 1 in places where the mask layer 21 had previously been arranged.

The invention is not limited to the exemplary embodiments by the description thereof. The invention rather includes each new feature as well as each combination of features, which particularly includes each combination of features in the claims, even though this features or this combination per se is not explicitly indicated in the claims or exemplary embodiments.

What is claimed is:

1. A semiconductor chip comprising:
a multiply-connected mask layer comprising openings, the openings completely penetrate the mask layer; and
a semiconductor layer sequence, which, at least in places is in direct contact with the mask layer,
wherein the semiconductor layer sequence is disposed on the mask layer,
wherein the mask layer comprises a light-transmissive material, and
wherein the light-transmissive material comprises an optical refractive index for light which is smaller than a refractive index of the semiconductor layer sequence;
wherein the semiconductor layer sequence includes an active region configured to generate light, and wherein light generated in the active region impinges, at least partially, on the mask layer.

2. The semiconductor chip according to claim 1, wherein the mask layer includes four or more openings.

3. The semiconductor chip according to claim 1, further comprising a growth substrate having a growth surface, wherein the growth surface comprises sapphire, and wherein the mask layer is arranged between the growth surface and the semiconductor layer sequence.

4. The semiconductor chip according to claim 3, wherein the semiconductor layer sequence is in regions of the openings, at least in places in direct contact with the growth surface of the growth substrate.

5. The semiconductor chip according to claim 4, wherein the optical refractive index of the light-transmissive material of the mask layer is smaller than a refractive index of the growth substrate.

6. The semiconductor chip according to claim 4, wherein the mask layer is partially removed and hollow spaces are arranged between the semiconductor layer sequence and the growth substrate in the places where the mask layer had previously been arranged.

7. The semiconductor chip according to claim 6, wherein the hollow spaces are filled with gas.

8. The semiconductor chip according to claim 1, wherein the mask layer is partially removed.

9. The semiconductor chip according to claim 1, wherein the mask layer contains a silicon oxide.

10. The semiconductor chip according to claim 1, wherein a distance between nearest openings is between at least 0.5 μm and at most 15 μm for at least some openings.

11. The semiconductor chip according to claim 1, wherein the openings are arranged at lattice points of a regular lattice.

12. The semiconductor chip according to claim 1, wherein a maximum lateral opening dimension is between at least 0.6 μm and at most 2.0 μm for at least some of the openings.

13. The semiconductor chip according to claim 1, wherein a thickness of the mask layer is between at least 0.2 μm and 10 μm at most.

14. The semiconductor chip according to claim 1, wherein the semiconductor layer sequence is completely formed over the mask layer.

* * * * *

UNITED STATES PATENT AND TRADEMARK OFFICE
CERTIFICATE OF CORRECTION

PATENT NO. : 10,727,052 B2
APPLICATION NO. : 16/240142
DATED : July 28, 2020
INVENTOR(S) : Tobias Gotschke Page 1 of 1

It is certified that error appears in the above-identified patent and that said Letters Patent is hereby corrected as shown below:

In the Claims

In Column 10, Line 66, Claim 12, delete "0.6" and insert --0.3--.

Signed and Sealed this
Thirteenth Day of October, 2020

Andrei Iancu
*Director of the United States Patent and Trademark Office*